(12) United States Patent
Lu

(10) Patent No.: US 6,329,107 B1
(45) Date of Patent: Dec. 11, 2001

(54) METHOD OF CHARACTERIZING PARTIAL COHERENT LIGHT ILLUMINATION AND ITS APPLICATION TO SERIF MASK DESIGN

(75) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/526,424

(22) Filed: Mar. 15, 2000

(51) Int. Cl.$^7$ .............................. G03F 9/00; G06F 17/50
(52) U.S. Cl. .................... 430/5; 430/30; 716/19; 716/21
(58) Field of Search .................... 430/5, 30, 322; 716/19, 21

(56) References Cited

U.S. PATENT DOCUMENTS

| | | | |
|---|---|---|---|
| 5,707,765 | 1/1998 | Chen | 430/5 |
| 5,723,233 | 3/1998 | Garza et al. | 430/5 |
| 5,795,688 | 8/1998 | Burdorf et al. | 430/30 |
| 5,801,954 | 9/1998 | Le et al. | 364/488 |
| 5,879,844 | 3/1999 | Yamamoto et al. | 430/30 |
| 5,885,734 | 3/1999 | Pierrat et al. | 430/5 |
| 5,900,338 | 5/1999 | Garza et al. | 430/5 |
| 6,127,071 | * 10/2000 | Lu | 430/5 |
| 6,214,494 | * 4/2001 | Bula et la. | 430/5 |

* cited by examiner

Primary Examiner—S. Rosasco
(74) Attorney, Agent, or Firm—McGinn & Gibb, PLLC; Richard M. Kotulak, Esq.

(57) ABSTRACT

A method and structure for serif mask design for correcting optical proximity effects in photolithography first characterizes a partial coherent light illumination from a photolithographic system and then utilizes the characterization results to perform serif mask design for the purpose of optical proximity corrections. The characterization of a partial coherent light illumination includes identifying an effective range of optical proximity effects for the photolithographic system, and focusing on slow-varying angle dependent terms in mutual intensity function, etc. The method and structure for serif mask design starts from ideal serif and hole design that work perfectly under a complete coherent illumination or under a complete incoherent illumination. For an outer corner, the initial design is a quarter-circle serif centered at the outer corner and located at the opposite quadrant of outer corner itself. The method then adjusts the size and shape of the serif until the image intensity at a point along the edge. For an inner corner, the initial design is a quarter-circle hole centered at the inner corner and located symmetrically inside the mask. The method then adjusts the size and shape of the serif until the aerial image intensity at the outer corner equals the aerial image intensity at a point along the edge.

43 Claims, 9 Drawing Sheets

METHOD OF CHARACTERIZING PARTIAL COHERENT LIGHT ILLUMINATION AND ITS APPLICATION TO SERIF MASK DESIGN

BACKGROUND OF THE INVENTION

1. Field of the Invention

The present invention generally relates to photolithography and more particularly to an improved mask and mask design methodology.

2. Description of the Related Art

Photolithography is the technology of reproducing patterns using light. As presently used in semiconductor industry, a mask pattern for a desired circuit is transferred to a wafer through light exposure, development, etch, resist strip, etc. As the feature size on a circuit becomes smaller and smaller, the circuit shape on the wafer differs from the original mask pattern more and more. In particular, corner rounding, line end foreshortening, etc. are typically observed. These phenomena are called optical proximity effects.

One of the main reasons for optical proximity effects is light diffraction. Optical proximity effects coming from light diffraction can be overcome partly if one has the choice of using a shorter wavelength source of light, with a projection system possessing a larger numerical aperture. In practice, the wavelength of an optical light source is typically fixed (e.g., 365 nm, 248 nm, 193 nm, 157 nm etc.) and there is a practical upper limit on numerical aperture. Thus, other resolution enhancement methods, including the use of phase-shifting masks and masks with serifs, have been developed to correct optical proximity effects.

The light illumination in lithography is typically a partial coherent light illumination. The aerial image for partial coherent light illumination is given by the Hopkins equation, $$I(\vec{r}) = K(\vec{r}, \vec{r}_1) K^*(\vec{r}, \vec{r}_2) M(\vec{r}_1) M^*(\vec{r}_2) J(\vec{r}_1, \vec{r}_2) d\vec{r}_1 d\vec{r}_2,$$

which is a nonlinear integral involving the mask transmission function M, the coherent point-spread function (i.e., the kernel function) K, and mutual intensity function J. It is often assumed that the imaging system is translation invariant, i.e., that $K(\vec{r}, \vec{r}') = K(\vec{r} - \vec{r}')$. In addition, a common assumption is that the mutual intensity function satisfies $J(\vec{r}_1, \vec{r}_2) = J(\vec{r}_1 - \vec{r}_2)$. For circular or annular aperture, the point-spread function between two points depends on their distance only, $K(\vec{r} - \vec{r}') = K(|\vec{r} - \vec{r}'|)$. Under these conditions, the Hopkins equation is usually simplified to $$I(\vec{r}) = \int\int K(|\vec{r} - \vec{r}_1|) K^*(|\vec{r} - \vec{r}_2|) M(\vec{r}_1) M^*(\vec{r}_2) J(\vec{r}_1 - \vec{r}_2) d\vec{r}_1 d\vec{r}_2 \quad (1)$$

for aerial image calculations.

Two methods have been previously suggested for finding the best/suitable mask shapes under partial coherent light illumination. Y. Liu et al. "Binary and phase-shifting mask design for optical lithography," IEEE Trans. Semiconductor Manufacturing 5, 138–152 (1992), incorporated herein by reference, treats a mask as a bitmap pattern, which consists of many pixels. The amplitude transmission at each pixel could be either 1 (with a possible fixed phase) or 0. The difficulty in this approach is that there are really too many combinations—it is 2 pixels. Y.C. Pati et al., "Phase-shifting masks for microlithography: automated design and mask requirements," J. Opt. Soc. Am. A 11, 2438–2452 (1994), incorporated herein by reference, uses a method called "optimal coherent approximation," which expresses the aerial image for a partial coherent light illumination as a sum of many coherent light illuminations. If this approximation is a good one, then perfect correction to both corner rounding and line end shortening can be achieved using a method disclosed previously in U.S. patent application Ser. No. 09/167,948, now U.S. Pat. No. 6,214,494, incorporated herein by reference, which is valid exactly for either coherent or incoherent light illuminations. The real situation for a partial coherent light illumination, however, is not this simple in general.

SUMMARY OF THE INVENTION

It is, therefore, an object of the present invention to provide a structure and method for designing a photolithographic mask comprising, defining a device shape on the mask, the device shape having at least one outside corner and at least one straight edge, adding a partial circular serif to the corner to prevent rounding of the corner in an image produced using the mask, the serif having a radius, and adjusting a size of the serif such that a first aerial image intensity at the outer corner is equal to a second aerial image intensity at a point along the edge. The first aerial image intensity at the outer corner contains light diffraction contributions coming from transparent parts of mask and serif that are within a first cycle having the radius and being centered at the outer corner. The second aerial image intensity at a point along the edge contains light diffraction contributions coming from the transparent half circle of mask layout that is within a second circle having the radius and being centered at the point along the edge. The serif comprises a quarter-circle serif. The serif has a same transparency as the design shape. The adjusting comprises one of adding and removing rectangular strips to/from straight edges of the serif. The rectangular strips have an edge aligned with an edge of the device shape. The adjusting comprises one of adding and removing radial sections to/from the serif to form a fan-shaped serif. The adjusting comprises removing a partial circular central portion from the serif to form a partial ring-shaped serif.

A further embodiment of the invention is to provide a structure and method for designing a photolithographic mask comprising defining a device shape on the mask, the device shape having at least one inside corner and at least one straight edge forming a partial circular hole in the corner to prevent rounding of the corner in an image produced using the mask, the hole having a radius, and adjusting a size of the hole such that a first aerial image intensity at the inner corner is equal to a second aerial image intensity at a point along the edge. The first aerial image intensity at the inner corner contains light diffraction contributions coming from transparent parts of mask and hole that are within a first circle having the radius and being centered at the inner corner. The second aerial image intensity at a point along the edge contains light diffraction contributions coming from the transparent half circle of mask layout that is within a second circle having the radius and being centered at the point along the edge. The hole comprises a quarter-circle hole. The hole has an opposite transparency from the design shape. The adjusting comprises one of adding and removing rectangular strips to/from straight edges of the hole. The rectangular strips have an edge aligned with an edge of the device shape. The adjusting comprises one of adding and removing radial sections to/from the hole to form a fan-shaped hole. The adjusting comprises removing a partial circular central portion from the hole to form a partial ring-shaped hole.

Further the invention provides a structure and method for a photolithographic mask comprising a device shape, the device shape having at least one outside corner and at least one straight edge, and a partial circular serif centered at the corner, the serif preventing rounding of the corner in an image produced using the mask, the serif having a radius, wherein a first aerial image intensity at the outer corner is equal to a second aerial image intensity at a point along the edge. The first aerial image intensity at the outer corner contains light diffraction contributions from transparent parts of mask and serif that are within a first circle having the radius and being centered at the outer corner. The second aerial image intensity at a point along the edge contains light diffraction contributions coming from the transparent half circle of mask layout that is within a second circle having the radius and being centered at the point along the edge. The serif comprises a quarter-circle serif. The serif has a same transparency as the design shape. The serif includes one of rectangular strips and rectangular holes along straight edges of the serif. The rectangular strips and the rectangular holes have an edge aligned with an edge of the device shape. The serif includes one of radial sections and radial holes such that the serif has a fan shape. The serif has a hole in a partial circular central portion and comprises a partial ring-shaped serif.

Further the invention provides a structure and method for a photolithographic mask comprising a device shape, the device shape having at least one inner corner and at least one straight edge, and a partial circular hole centered at the corner, the hole preventing rounding of the corner in an image produced using the mask, the hole having a radius, wherein a first aerial image intensity at the inner corner is equal to a second aerial image intensity at a point along the edge. The first aerial image intensity at the inner corner contains light diffraction contributions coming from transparent parts of mask and hole that are within a first circle having the radius and being centered at the inner corner. The second aerial image intensity at a point along the edge contains light diffraction contributions coming from the transparent half circle mask layout that is within a second circle having the radius and being centered at the point along the edge. The hole comprises a quarter-circle hole. The hole has an opposite transparency from the design shape. The hole includes one of rectangular strips and rectangular holes along straight edges of the hole. The rectangular strips and the rectangular holes have an edge aligned with an edge of the device shape. The hole includes one of radial sections and radial holes such that the hole has a fan shape. The hole has a opposite transparency region in a partial circular central portion and comprises a partial ring-shaped hole.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
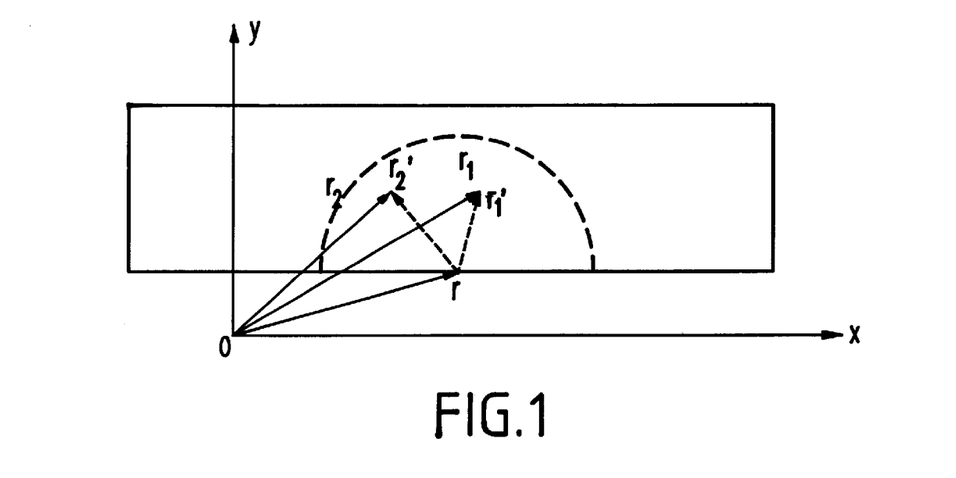
FIG. 1 is a schematic architectural diagram illustrating global and local coordinate systems.

The invention characterizes partial coherent light illumination and uses this characterization to produce optical proximity correction. The characterization process begins by introducing many local coordinate systems, one for each position $\vec{r}$ at which the invention is going to find its aerial image intensity. For a position $\vec{r}$, the invention introduces a local coordinate system centered at $\vec{r}$. The invention uses a prime to indicate a coordinate in the local coordinate system. For a point with coordinate $\vec{r}$ in the global coordinate system, its coordinate is $\vec{r}_1{}'$ in the local coordinate system (see FIG. 1). The relationship between $\vec{r}_1{}'$ and $\vec{r}$, is $\vec{r}_1{}' = \vec{r}_1 - \vec{r}$. Similarly, for a second point $\vec{r}_2$, its coordinate in the local coordinate system is $\vec{r}_2{}'$ with relationship $\vec{r}_2{}' = \vec{r}_2 - \vec{r}$.

The invention characterizes mutual intensity function in terms of local polar coordinates $\vec{r}{}'_1 = (r'_1, \phi'_1)$, and $\vec{r}{}'_2 = (r'_2, \phi'_2)$, $$J(\vec{r}'_1 - \vec{r}'_2) = \sum_{k=0}^{\infty} f_k(r'_1, r'_2) \cos[k(\phi'_1 - \phi'_2)] \qquad (2)$$

which consists of 1 angle independent term $f_0(r'_1, r'_2)$ and many angle dependent terms. Because of symmetry $J(\vec{r}{}'_2 - \vec{r}{}'_1) = J(\vec{r}{}'_1 - \vec{r}{}'_2)$ it is known that $f_k$ is also symmetric with respect to its two arguments, $f_k(r'_2, r'_1) = f_k(r'_1, r'_2)$, and that sin

[$k(\phi'_1-\phi'_2)$] terms are not present. The radial functions $f_k(r'_1,r'_2)$ can be determined either experimentally or theoretically. When the mutual intensity function depends only on the square of the magnitude of its argument, $J(\vec{r}'_1-\vec{r}'_2)=J(|\vec{r}'_1-\vec{r}'_2|^2)$, it is easy to see that the characterization (2) is valid. The reasons are simple. First the argument of the mutual intensity function can be written as $|\vec{r}'_1-\vec{r}'_2|^2 = r'^2_1 + r'^2_2 - 2r'_1 r'_2 \cos(\phi'_1 - \phi'_2)$.

Second, any function of $|\vec{r}'_1 - \vec{r}'_2|^2$ can be expressed as a polynomial through Taylor series expansion. The $n^{th}$ power term of the polynomial is the $|\vec{r}'_1 - \vec{r}'_2|^{2n}$ term, which contains $\cos^k(\phi'_1-\phi'_2), k=1, 2, 3, \ldots, n$. The factor $\cos^k(\phi'_1-\phi'_2)$ in turn can be expressed as a linear combination of $$\cos[k(\phi'_1 - \phi'_2)], \cos[(k-2)(\phi'_1 - \phi'_2)], \ldots, \{\cos(\phi'_1 - \phi'_2) \text{ or } 1\}.$$

In the local coordinate system and under characterization (2), the Hopkins equation now becomes a summation of many integrals, $$I(\vec{r}) = \sum_{k=0}^{\infty} \int\int K(r'_1) K^*(r'_2) f_k(r'_1, r'_2) r'_1 dr'_1 r'_2 dr'_2 \qquad (3)$$

$$\int\int M(\vec{r}+\vec{r}'_1) M^*(\vec{r}+\vec{r}'_2) \cos[k(\phi'_1 - \phi'_2)] d\phi'_1 d\phi'_2$$

The advantage of characterization (2) now becomes clear: In certain important situations, the double integration on a 2D area can be separated into a double integral over angle and another double integral over radial variable. This disclosure will illustrate this benefit below when the invention applies the summation form of the Hopkins equation (3) to the problem of optical proximity correction (OPC).

An ideal imaging system would make the aerial image intensity at a corner point of, e.g., a rectangular mask shape equal to that at an edge point of the rectangle. Due to the optical diffraction, this is certainly not the case.

One important task in OPC is to find a suitable serif so that the aerial image intensity at the corner point is the same as that at the edge point. This disclosure discusses in the following how to achieve this objective for various situations.

Let R be the kernel function's effective radius or a resolution limit of lithograph system. Namely, $K(r) \approx 0$ when $r > R$, or $$\int_R^r K(r') r' dr'$$

(for any $r > R$) can be neglected when compared with $$\int_0^R K(r') r' dr'.$$

The highest aerial image intensity is achieved at the center of a well-lighted region. For the center of a wire (assuming a negative mask), this requires the effective radius being less than half of wire width, i.e., $R > \frac{1}{2}w$. When this is the case, the mask transmission function $M(\vec{r})$ is a constant (assume to be 1) in a circular region centered at the point $\vec{r}$, and characterization (3) reduces to $$I(center) = \sum_{k=0}^{\infty} F_k \int_0^{2\pi}\int_0^{2\pi} \cos[k(\phi'_1 - \phi'_2)] d\phi'_1 d\phi'_2 \qquad (4)$$

$$= 4\pi^2 F_0, \quad F_0 > 0,$$

where $$F_k = \int_0^R\int_0^R K(r'_1) K^*(r'_2) f_k(r'_1, r'_2) r'_1 dr'_1 r'_2 dr'_2 \qquad (5)$$

is the kth full-range radial integral. Thus each angle-dependent term (k = 1, 2, 3, . . .) does not make any net contribution to the aerial image in the center; namely, for each angle-dependent term, the net contribution from a full ring structure is zero due to cancellations.

Figure 2:
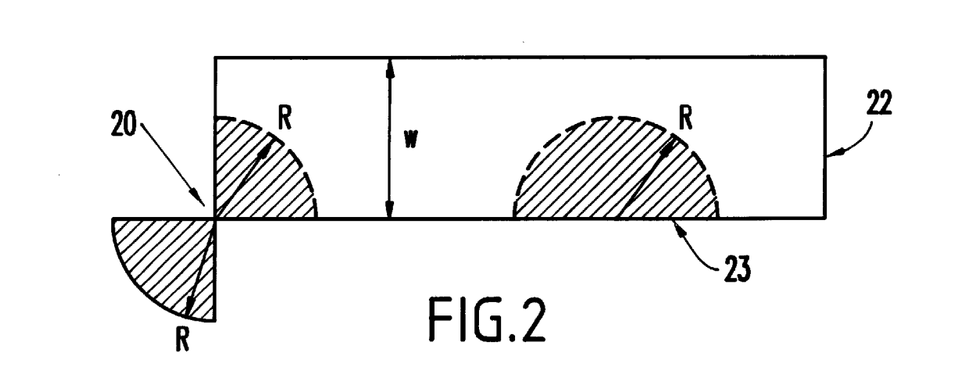
FIG. 2 is a schematic architectural diagram illustrating quarter circle serifs.

Referring now to FIG. 2, a mask feature 22 that has a corner 20 is illustrated. The mask feature (e.g., device shape) 22 can be either opaque or transparent depending upon whether the mask is positive or negative. In addition, as discussed above, to eliminate corner rounding a serif 21 (that has the same transparency as the mask feature 22) is added to the mask feature 22. The size of the serif 21 is controlled with the invention to ensure that the image intensity at the corner 20 is equal to the image intensity at the edge 23 (e.g., I(corner)=I(edge)).

When the mask is exposed, the actual image that is produced by the mask will have a rounded corner if the serif 21 is too small. To the contrary, if the serif 21 is too large, the serif 21 may appear in the actual image that is produced by the mask. Therefore, by controlling the size of the serifs and holes in the manner shown in FIGS. 3, 6–10 and 12–14, the invention prevents the actual image (that is projected when the mask is exposed) from having a corner that is rounded and prevents the serif 21 from appearing in the actual image (e.g., the serif is not printed). Therefore, the invention prevents corner rounding and does not print the serifs.

When the effective radius of the kernel function K is less than the wire width (see FIG. 2), i.e., when R<w, the aerial intensity at an edge point (assuming its distance to any corner is larger than R) is found from characterization (3), $$I(edge) = \sum_{k=0}^{\infty} F_k \int_0^{\pi}\int_0^{\pi} \cos[k(\phi'_1 - \phi'_2)] d\phi'_1 d\phi'_2 \qquad (6)$$

$$= \pi^2 F_0 + \sum_{n=0}^{\infty} \frac{4F_{2n+1}}{(2n+1)^2}.$$

One sees that each of the even-order angle-dependent terms (k=2n) does not make any net contribution from a half ring structure to the ring center. For the lower left corner 20 shown in FIG. 2, with added ½ circle serif, the aerial image intensity at the corner is $$I(corner) = \sum_{k=0}^{\infty} F_k A_k(0) \qquad (7)$$

$$= \pi^2 F_0 + \sum_{n=0}^{\infty} \frac{16 F_{4n+2}}{(4n+2)^2}.$$

Here, $A_k$ is a more general angle integral defined as $$A_k(a) = \int_0^{2\pi} \int_0^{2\pi} m(\phi_1'; a) m(\phi_2'; a) \cos[k(\phi_1' - \phi_2')] d\phi_1' d\phi_2', \quad (8)$$

and m(φ;a) describes a mask transmission function in the angle direction (assuming a negative mask, i.e., light passes through within the mask and serif), $m(\phi;a)=1, \ 0 \leq \phi \leq \frac{1}{2}\pi$ or $$\pi - a \leq \phi \leq \frac{3}{2}\pi + a; \quad (9)$$

m(φ;a)=0, otherwise.

This angle integral is non-negative, $A_k(a) \geq 0$, $-\pi/4 \leq a \leq \pi/2$. When $F_k = 0$ [or $f_k(r_1, r_2) = 0$ for any $r_1, r_2$], $k = 1, 2, 3, \ldots$, intensity expressions (6) and (7) become very simple, $$I(\text{edge}) = I(\text{corner}) = \pi^2 F_0 \quad (10)$$

Namely, the aerial image intensities at an edge point and at the corner are the same. The quarter circle-shape serif works here. Moreover, this equal aerial intensity holds for any point on the edge, no matter how close/far it is away from the lower left corner 20 in FIG. 2. In other words, both corner rounding and line end shortening can be corrected completely in this case, and this is the same for coherent light illumination or for incoherent light illumination.

When the contribution from the first angle-dependent term is non-zero, $F_1 \neq 0$, but none of any other angle-dependent terms has any net contributions (i.e., $F_k=0$, k=2, 3, . . . ), the invention find from intensity expressions (6) and (7) that $I(\text{edge}) = \pi^2 F_0 + 4F_1,$ $I(\text{corner}) = \pi^2 F_0. \quad (11)$ Two situations occur here, depending on the sign of $F_1$.

Figure 3:
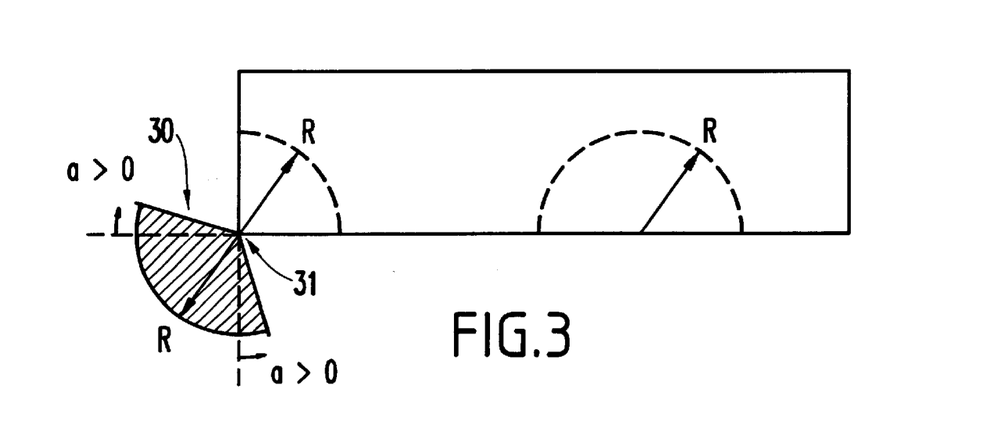
FIG. 3 is a schematic architectural diagram illustrating a fan-shaped serif that has a radius R and an angle which is larger than 90 degrees.
Figure 4:
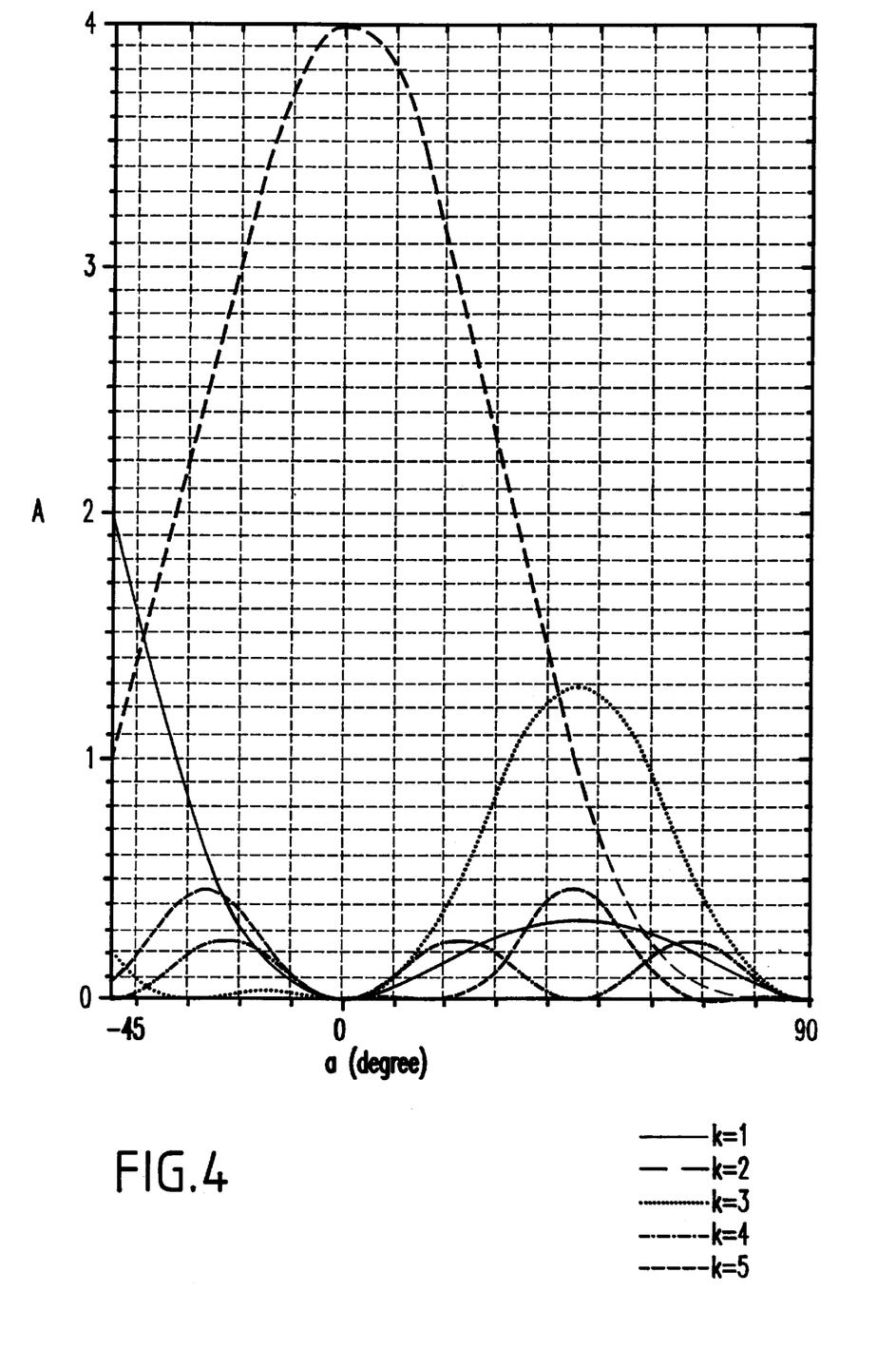
FIG. 4 is a graph illustrating angle integration over two segments.

If the contribution from the first angle-dependent term $F_1$ is positive, $F_1 > 0$, there is, in this case, less image intensity at the corner than at an edge point, I(corner)<I(edge). In order to make the aerial image intensities at the corner and at the edge equal, I(corner)=I(edge), the invention needs to increase the serifs size. FIG. 3 shows a fan-shaped serif 30 centered at a corner 31 and with a radius R and an angle larger than π2. When the fan's angle is increased from a =0 to its maximum value of a=π/2, the intensity at the corner, I(corner), reaches that of a center point, I (center). As long as I(center)>I(edge) (which is true for a negative mask), a has its solution $a_0$, between 0 and π/2, i.e. , 0>$a_0$>π/2. In other words, the solution $a_0$ of a is bracketed in the interval (0, π/2). Notice that, when a ≠0, Eq. (11) above no longer holds exactly. FIG. 4 is a graph showing the angle integral $A_k(a)$ defined in Eq. (8) as a function of a for first 5 k values. A detailed calculation shows that, for the lower left corner 31 in FIG. 3, $$I(\text{corner}) = (\pi + 2a)^2 F_0 + A_1(a) F_1 \quad (12)$$

-continued $$= (\pi + 2a)^2 F_0 + 4\left[\frac{1}{2} + \sin^2\left(\frac{1}{4}\pi + a\right) - \cos a - \sin a\right] F_1$$

$$\geq (\pi + 2a)^2 F_0.$$

Thus, the invention find the solution is within the range $$0 \leq a_0 \leq \sqrt{\pi^2 + \frac{4F_1}{F_0}} - \pi.$$

Figure 5:
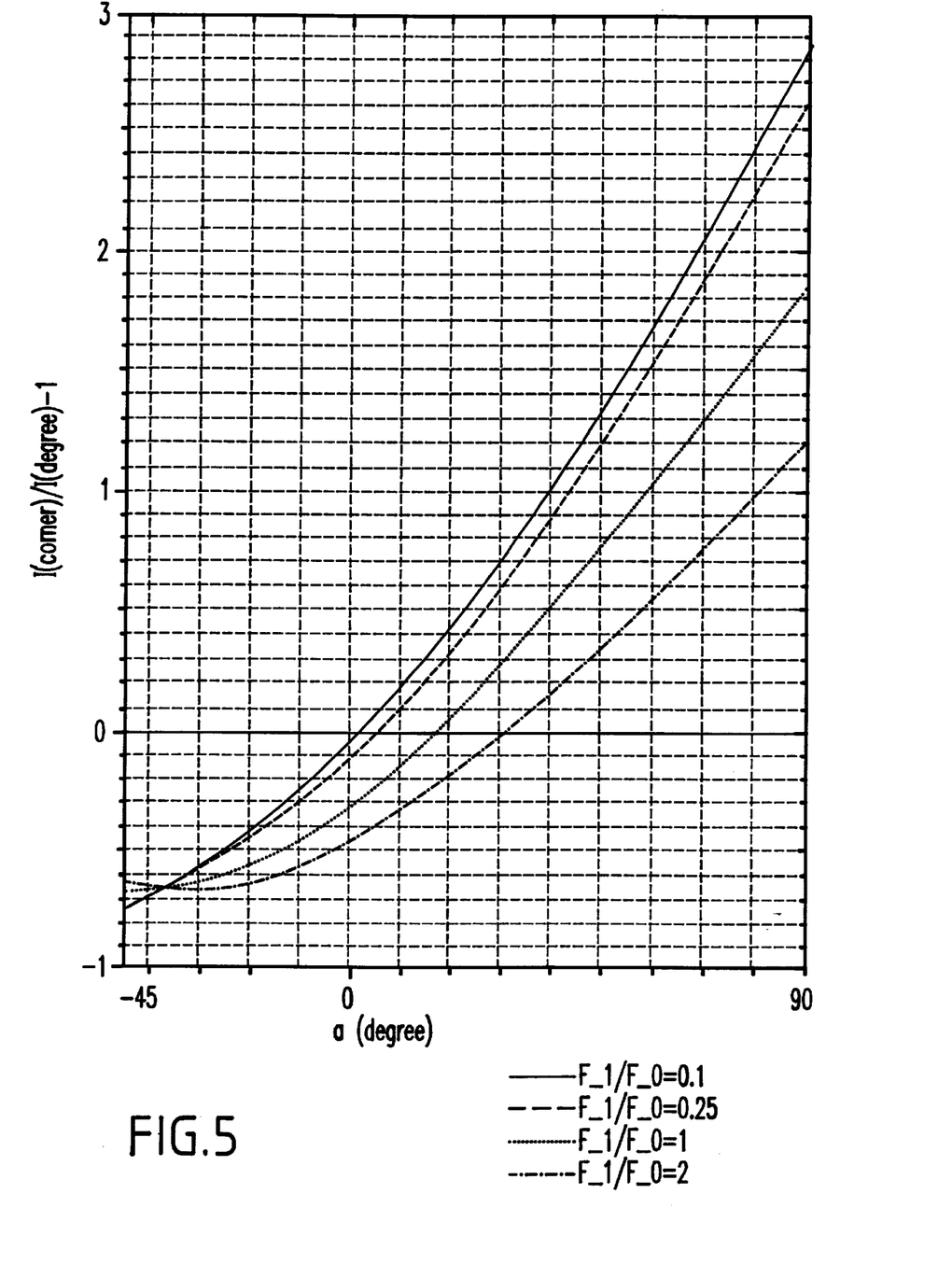
FIG. 5 is a graph illustrating the fan-shaped serif's angle.

The exact solution can be found by plotting I (corner)/I (edge)−1 as a function of a, as is done in FIG. 5 for several different ratios of $F_1/F0$. For each curve in FIG. 5, its cross point with the x axis gives the solution $a_0$ for that ratio of $F_1/F0$. As illustrated in FIG. 5, the solution $a_0$ is a function of the ratio $F_1/F0$.

Figure 6:
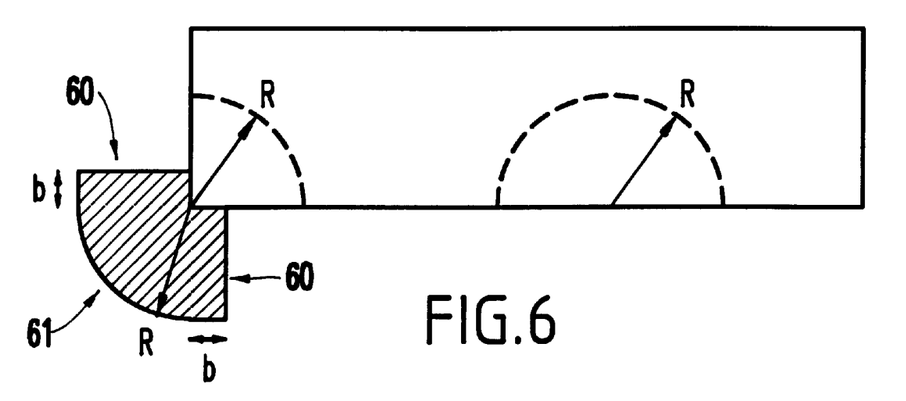
FIG. 6 is a schematic architectural diagram illustrating an alternative enlargement of a quarter circle serif.

Another way to increase serif size is illustrated in FIG. 6, where two rectangles 60 are added to a ¼ circle serif 61. Notice that, when the width b of the rectangles is increased to R, the aerial intensity at the corner, I (corner), becomes equal to the aerial image intensity at a center point, I (center). Again, as long as I(center)>I(edge) (which is true for a negative mask), the width b of the small rectangles has its solution $b_0$ within 0 and R, i.e., 0<$b_0$<R. The bracketing method assures that there is a suitable value for the width of the small rectangles to make I(corner)=I(edge).

Both methods shown in FIGS. 3 and 6 can give a suitable serif shape and size to achieve I(corner)=I(edge). The determination of which serif is better can be made by choosing a near-corner edge point (i.e., an edge point whose distance to the corner is less than R) and comparing the two aerial image intensities I (near-corner edge) from the two serifs at the near-corner edge point. For example, the invention can choose that serif which gives the smaller difference between I (near-corner edge) and I (edge). Other criteria can also be used to make the selection, such as comparing the aerial images produced by mask in FIG. 3 and that produced by mask in FIG. 6.

If the contribution from the first angle-dependent term is negative, $F_1 > 0$, the invention has the opposite situation, I (corner)>I (edge). Here, the invention needs to decrease serif size to make I (corner)=I(edge). FIGS. 7–10 show several methods of doing so, starting from an initial ¼ circle serif.

Figure 7:
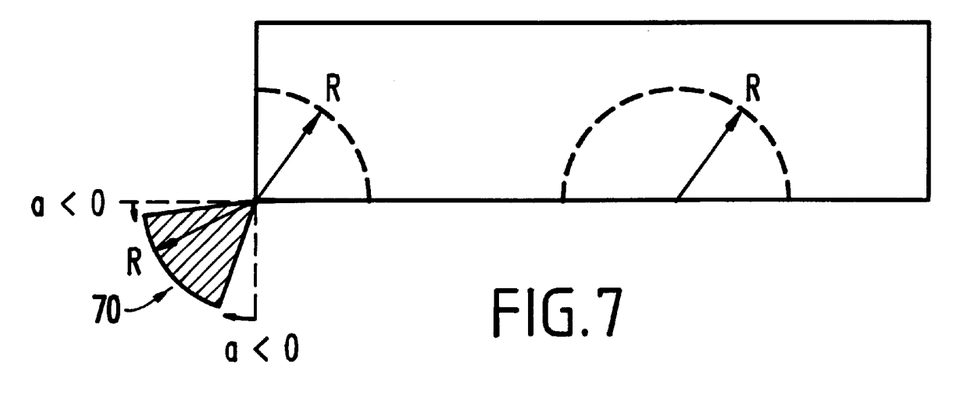
FIG. 7 is a schematic architectural diagram illustrating a fan shape serif which has a radius R and an angle which is less than 90 degrees.
Figure 8:
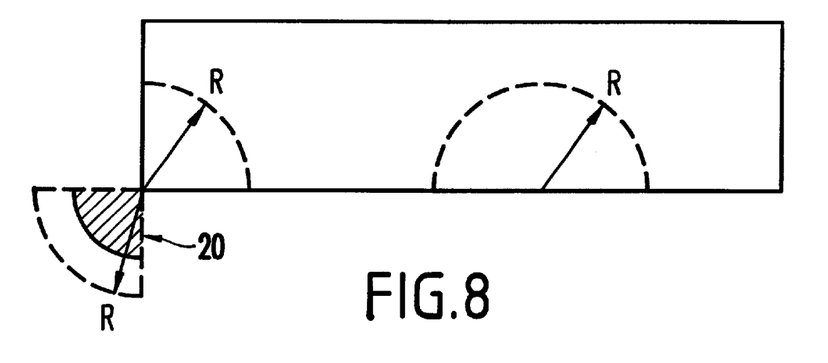
FIG. 8 is a schematic architectural diagram illustrating a quarter circle serif whose radius is less than the kernel functions radius R.
Figure 9:
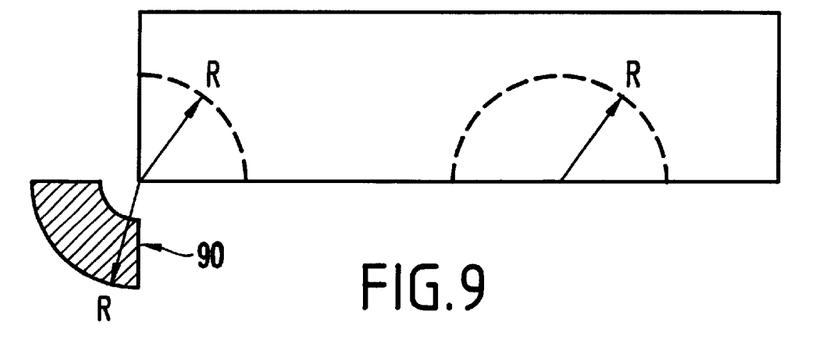
FIG. 9 is a schematic architectural diagram illustrating a quarter ring serif having an outer radius R.
Figure 10:
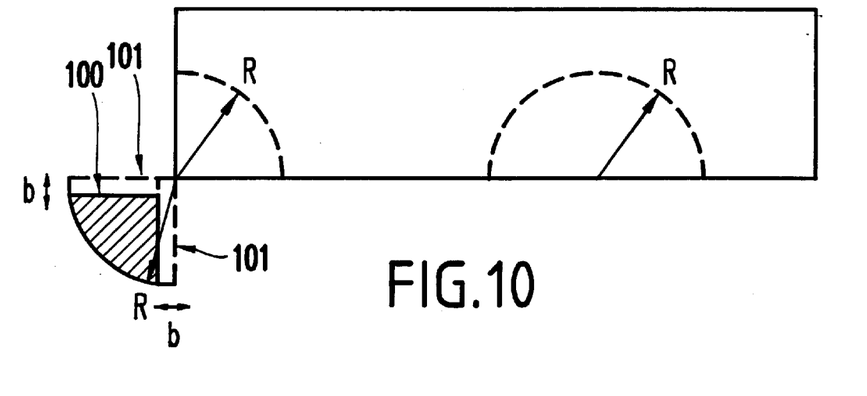
FIG. 10 is a schematic architectural diagram illustrating a serif that is reduced in size by removing horizontal and vertical strips from an original quarter circle shape.

For example, the serif shape 70 in FIG. 7 is also a fan of radius R, similar to that in FIG. 3, but now with angle a being negative. Expression (12) can again be used in this case to find the solution of angle a, which is between −π/4 and 0. In FIG. 8, the serif shape 80 stays as a quarter circle but reduces its radius to be less than the kernel function's radius R. In FIG. 9, the serif area 90 is reduced by using a quarter ring structure with its outside radius being R. In FIG. 10, the serif area 100 is decreased by cutting out two thin strips 101. It is easy to see that as the invention gradually reduces serif size for each of methods shown in FIGS. 7–10, a proper value of adjustable parameter will definitely be found. The reason is based on bracketing. At the end of this area reduction process, the serif area will become zero, at which point the aerial intensity at a pure (i.e, no serif compensation) corner is less than that at an edge point. Thus, during this area reduction process, there exists a suitable serif size for which I(corner)=I(edge).

Now the invention can have 4 different suitable serif shapes and sizes to achieve I(corner)=I(edge). To determine which serif shape is the best, the invention again chooses one or more near-corner edge points and compares the 4 sets of different I(near-corner edge) against I(edge) to make a choice among the 4 serif shapes. Other criteria can also be used to make the selection, such as comparing the aerial image produced by mask shapes in FIGS. 7–10.

The above discussions assume that the mask was a negative mask, i.e., light passes within the mask and within the serif. However, the invention is equally applicable to a positive mask. For a positive (i.e., opaque) mask for which light passes outside the mask, the angle transmission function given in Eq. (9) should be replaced by $$m(100;a)=1$$

when $$\tfrac{1}{2}\pi \leq \phi \leq \pi-a$$

or $$\tfrac{3}{2}\pi+a \leq \phi \leq 2\pi$$

and $$m(\phi;a)=0$$

otherwise. Notice that expression (11) is still valid. For the case of $F_1>0$ discussed above, the invention now needs to decrease serif size to obtain I(corner)=I(edge). This can be achieved using one of methods discussed in FIGS. 7–10 For the case of $F_1<0$, the invention now needs to decrease serif size to arrive at I(corner)=I(edge). This can be accomplished using the method shown in either FIG. 3 or FIG. 6.

To be specific, the invention will assume negative masks in the following discussions. As would be known by one ordinarily skilled in the art given this disclosure, for positive masks, discussions follow the same arguments and usually the conclusions are the same.

When the net contribution from the second angle-dependent term is nonzero, $F_2 \neq 0$, and all the rest of $F_k$ are zero (i.e., $F_2=0$, k=1, 3, 4, 5, ...), the invention find from Eqs. (6) and (7) that $$I(\text{edge})=\pi^2 F_0, \tag{13}$$

$$I(\text{corner})=\pi^2 F_0+4F_2.$$

If the contribution from the second angle-dependent term is positive, $F_2>0$, the invention has I(corner)>I(edge) in this case. In order to make I(corner)=I(edge), the invention needs to decrease serif size. The same types of serfs as shown in FIGS. 7–10 can be used in this case. Based on the same arguments, for each serif area reduction method, a correct serif dimension can be found definitely to make I(corner)=I(edge).

If the contribution from the second angle-dependent term is negative, $F_2<0$, the invention have I(corner)<I(edge) instead. Now the invention needs to decrease serif size to make I(corner)=I(edge). The same types of serif shapes as shown in FIGS. 3 and 6 apply here too, and there exists a suitable a (for FIG. 3) and b (for FIG. 6) to achieve I(corner)=I(edge).

Without any assumption about $F_k$, the invention can always start from the quarter circle serif in FIG. 2.

If I(corner)<I(edge) initially, the invention can increase the quarter circle serif size as described in FIG. 3 or 6 to reach a right dimension at which I(corner)=I(edge) because as the serif size is increased to $a=\pi/2$ (for FIG. 3) or to b=R (for FIG. 6), the aerial intensity at the corner becomes equal to that of a center point and becomes larger than I(edge). So, in the middle of this process, there exists a suitable a (for FIG. 3) and b (for FIG. 6) to make I(corner)=I(edge).

On the other hand, if I(corner)>I(edge) initially, the invention can decrease the quarter circle serif size using any method shown in FIGS. 7–10 to reach I(corner)=I(edge). The reason here is also based on bracketing. As the serif size is reduced to zero, the aerial intensity at the corner becomes that of a pure corner, which is less than I(edge). Consequently, in the middle of each serif area reduction process shown in FIGS. 7–10, there exists a solution to the variable the invention is adjusting.

Figure 11:
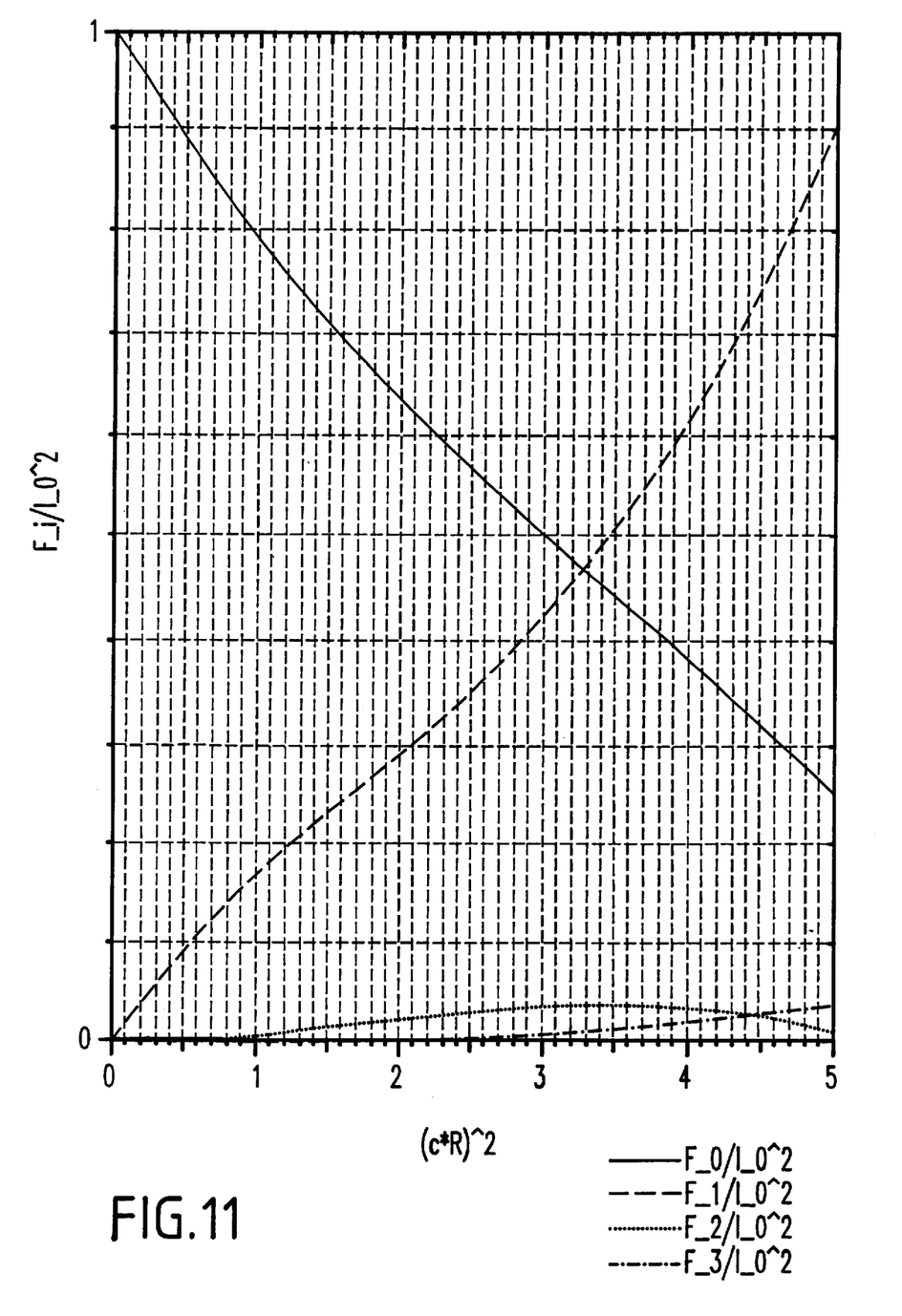
FIG. 11 is a graph illustrating radial integration.
Figure 12:
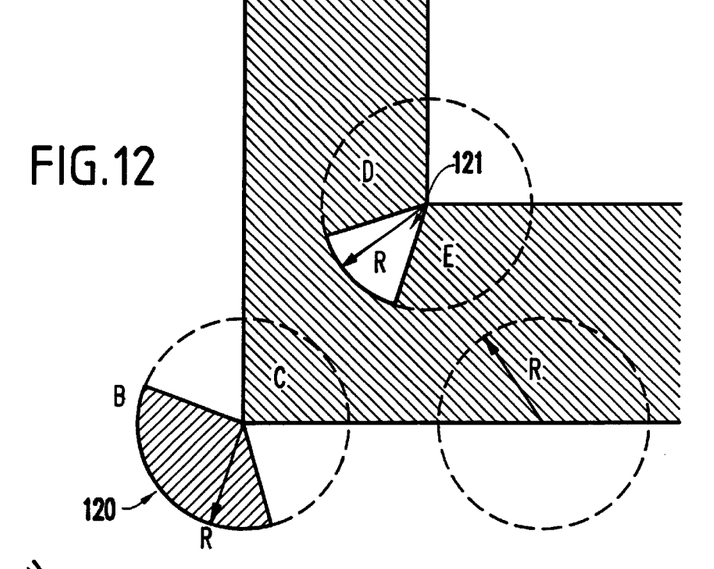
FIG. 12 is a schematic architectural diagram illustrating a fan-shaped hole in an inner corner of an elbow; and another fan-shaped serif attached to an outer corner of the elbow.

In most cases, only first few angle-dependent terms are needed for fast calculations/optimizations, and the rest of angle dependent terms can be safely neglected. There are two reasons for this simplification. (1) First, for fast angle oscillation terms (i.e., when k is large), the maximum contribution of $A_k(a)$ is, roughly speaking, proportional to $1/k^2$. Namely, $A_k|\max$ varies as $1/k2$. Or, more precisely, $A_k|\max$ is of the order $O(8/k2)$ or less. (2) The second reason is that typically, $$|F_0| > |F_1| > |F_2| > |F_3| > \ldots,$$

and $|F_k| \to 0$ when $k \to \infty$. FIG. 11 displays the radial integrals Fk as a function of the square of a scaled coherence factor, $(cR)2$, where the parameter c is proportional to the coherence factor $\sigma$ of the imaging system. Notice that a coherent light illumination corresponds to c=0. In FIG. 11, $$I_0 = \int_0^R K(r) r d r = \frac{3}{20} R^2$$

is the radial integral of the kernel function, and the kernel function used is continuous and smooth everywhere, $$K(r)=1-3(r/R)^2+2(r/R)^3, \; r \leq R$$

$$K(r)=0, \; r \geq R.$$

In addition, the mutual intensity function used is $2J(c|\vec{r}_1-\vec{r}_2|)/(c|\vec{r}_1-\vec{r}_2|)$ truncated at $c^6|\vec{r}_1-\vec{r}_2|^6$ terms, $$J(\vec{r}_1-\vec{r}_2) = 1 - \frac{1}{2}c^2|\vec{r}_1-\vec{r}_2|^2 + \frac{1}{12}c^4|\vec{r}_1-\vec{r}_2|^4 - \frac{1}{144}c^6|\vec{r}_1-\vec{r}_2|^6,$$

where $J_1$, is the first order Bessel function of the first kind.

Due to the above two reasons, in practice, the invention only needs to keep up to the third or even second angle-dependent terms in characterization (2) to speed up numerical calculations/optimization.

In the above discussions, the invention has used an outer corner as an example. The same arguments also apply to an inner corner, such as the inner corner of an elbow shape mask (see FIG. 12). For an inner corner, the invention can take out a fan shape area 121 to make I(corner)=I(edge). As the angle of the fan 121 increases from 0° to its maximum value of 270°, the aerial image intensity decreases from larger than I(edge) initially to zero at the end. Consequently, it is clear that there exists a suitable angle at which I(corner)=I(edge). Usually, when the added fan 120 at the outer corner has an angle larger than 90°, the angle of the cut-off fan is less than 90°.

Figure 13:
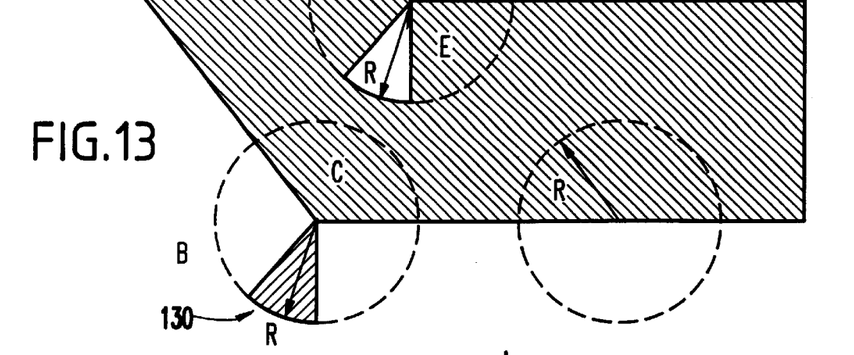
FIG. 13 is a schematic architectural diagram illustrating a 45 degree turn mask having a fan-shaped serif on the outer corner and a fan-shaped hole upon the inner corner.

Besides 90° turns made by an elbow shape wire, some wires make 45° turns. To make I(corner)=I(edge) for a 45° turn mask, the invention can add an about 45° fan shaped serif 130 at its outer corner and take out an about 45° fan shaped hole 131 at its inner corner as shown in FIG. 13. The exact 45° fan shaped serifs will work for the case of no angle-dependent terms discussed above. For the general case, the invention can either increase or decrease the fan's angle to achieve I(corner)=I(edge). Following the same argument presented above, it can be shown that there exists a suitable angle at which I(corner)=I(edge). Other methods of design serif shapes, such as reduce the fan's radius, add or subtract strips from 45° fan, etc. as shown in FIGS. 6–10 can also be used to find correct serif shape and size.

Figure 14:
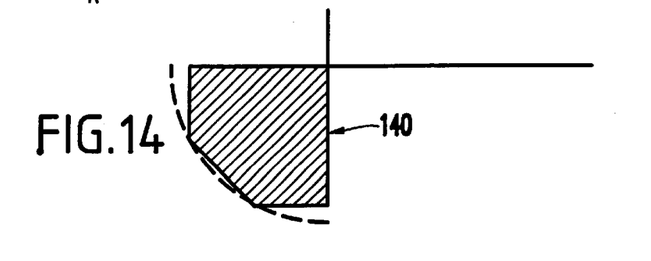
FIG. 14 is a schematic architectural diagram of a quarter-circle serif formed using only zero, 45, and 90-degree lines.
Figure 15:
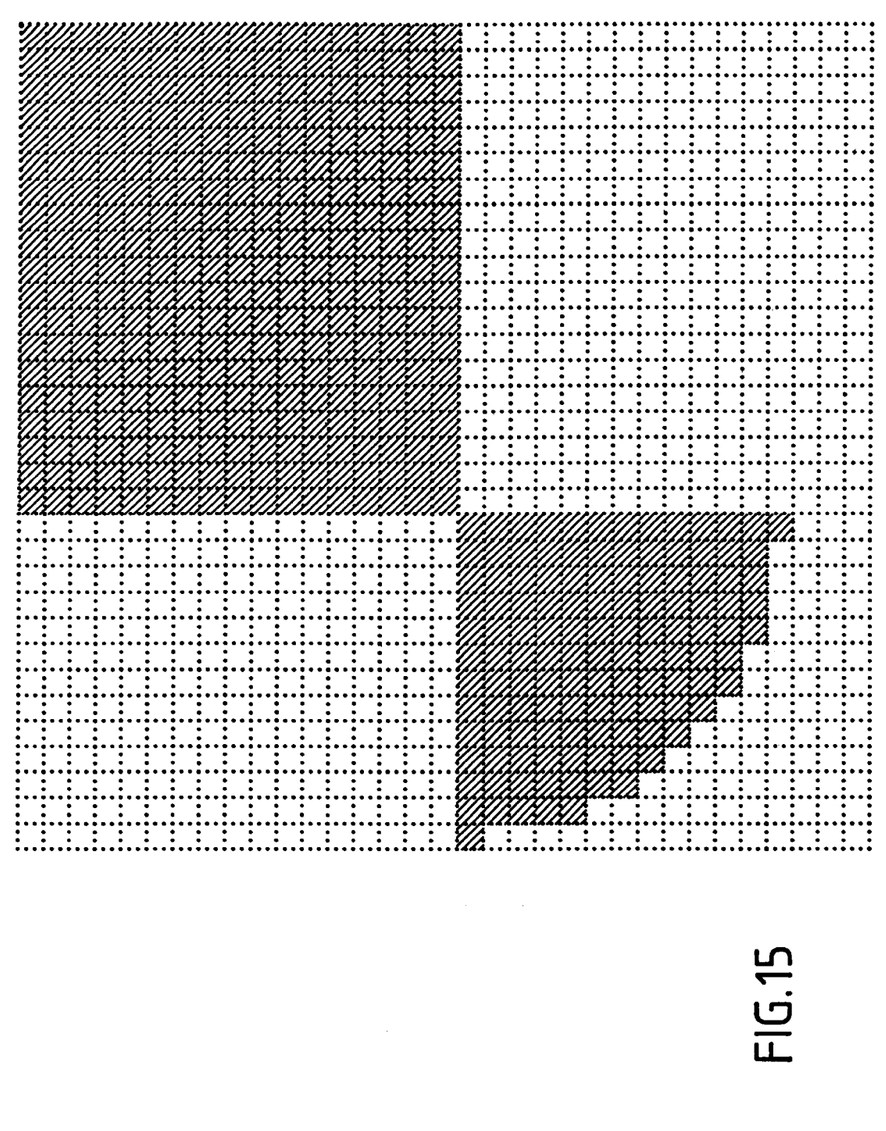
FIG. 15 is a schematic architectural diagram of a bit-mapped representation of serif shape.

For applications in current mask making capability, the above various serif shapes can be approximated by 0°-, 45°-, and 90°-line representation. For example, a quarter circle 140 can be approximated as shown in FIG. 14. Also, the above various serif shapes can be approximated by their bit-map representation (see FIG. 15).

Figure 16:
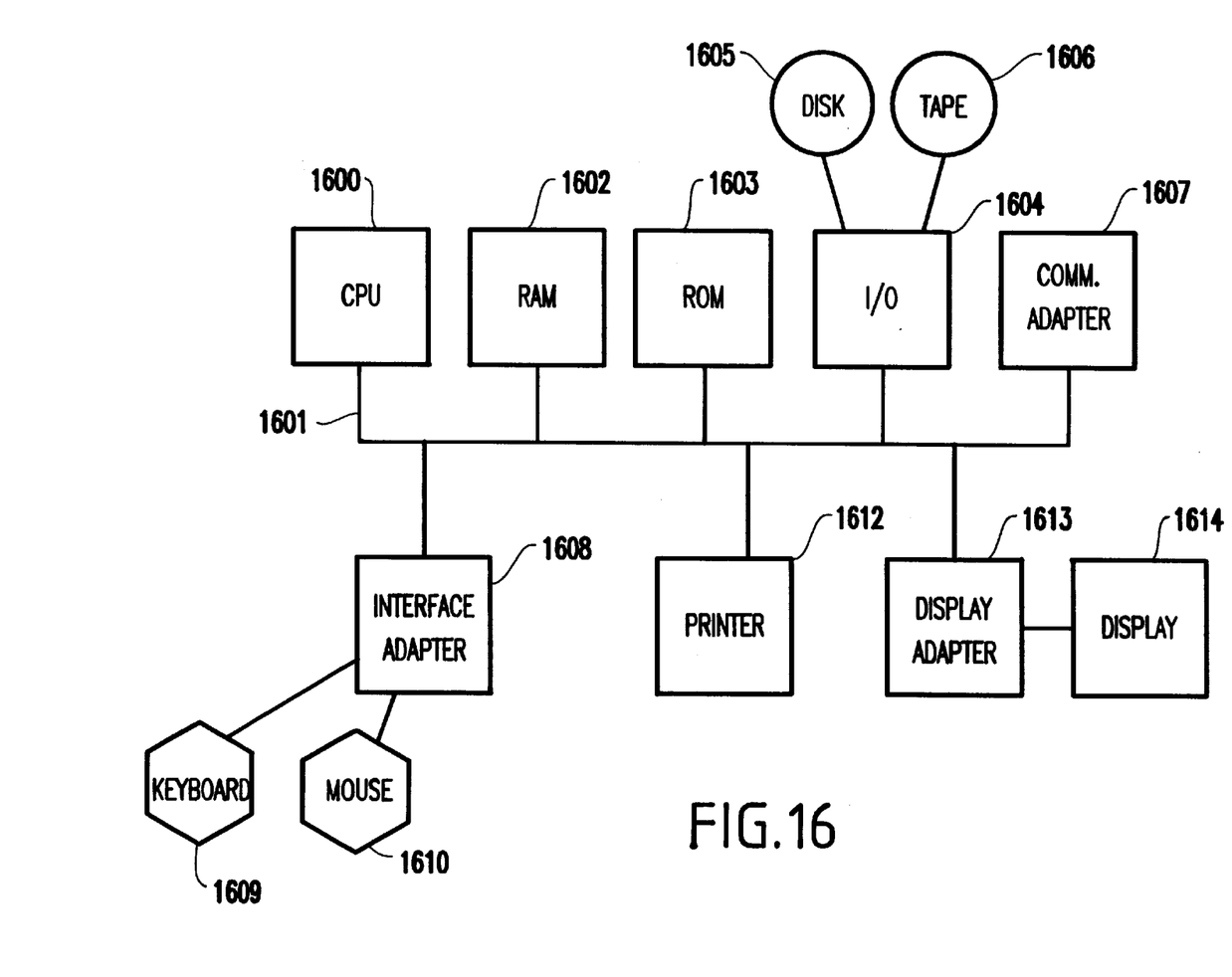
FIG. 16 is a typical hardware configuration of an information handling computer system.

While the overall methodology of the invention is described above, the invention can be embodied in any number of different types of systems and executed in any number of different ways, as would be known by one ordinarily skilled in the art. For example, as illustrated in FIG. 16, a typical hardware configuration of an information handling/computer system in accordance with the invention preferably has at least one processor or central processing unit (CPU) 1600. For example, the central processing unit 1600 could include various image/texture processing units, mapping units, weighting units, classification units, clustering units, morphing units, filters, adders, subtractors, comparators, etc. Alternatively, as would be known by one ordinarily skilled in the art given this disclosure, multiple specialized CPU's (or other similar individual functional units) could perform the same processing, mapping, weighting, classifying, clustering, morphing, filtering, adding, subtracting, comparing, etc.

The CPU 1600 is interconnected via a system bus 1601 to a random access memory (RAM) 1602, read-only memory (ROM) 1603, input/output (I/O) adapter 1604 (for connecting peripheral devices such as disk units 1605 and tape drives 1606 to the bus 1601), communication adapter 1607 (for connecting an information handling system to a data processing network) user interface adapter 1608 (for connecting a peripherals 1609–1610 such as a keyboard, mouse, microphone, speaker and/or other interface device to the bus 1601), a printer 1612, and display adapter 1613 (for connecting the bus 1601 to a display device 1614). The invention could be implemented using the structure shown in FIG. 16 by including the inventive method, described above, within a computer program stored on the storage device 1605. Such a computer program would act on mask information supplied through the interface units 1609–1610 or through the network connection 1607. The system would then automatically make add serifs and/or holes to the mask and output the same on the display 1614, through the printer 1612 or back to the network 1607.

The above discussed methods of correcting corner rounding under partial coherent illumination can be used in an OPC software, which optimize the serif/hole shape at one corner of a large IC layout and then copies the same optimized serif design to many corners in the large IC mask layout.

While the invention has been described in terms of preferred embodiments, those skilled in the art will recognize that the invention can be practiced with modification within the spirit and scope of the appended claims.

What is claimed is:

1. A method of designing a photolithographic mask comprising:

defining a device shape on said mask, said device shape having at least one outside corner and at least one straight edge;

adding a partial circular serif to said corner to prevent rounding of said corner in an image produced using said mask; and adjusting a size and shape of said serif such that a first aerial image intensity at said corner is equal to a second aerial image intensity at a point along said edge.

2. The method in claim 1, wherein said serif comprises a quarter-circle serif.

3. The method in claim 1, wherein said serif has a same transparency as said design shape.

4. The method in claim 1, wherein said adjusting comprises one of adding and removing rectangular strips to/from straight edges of said serif.

5. The method in claim 4, wherein said rectangular strips have an edge aligned with an edge of said device shape.

6. The method in claim 1, wherein said adjusting comprises one of adding and removing angle sections to/from said serif to form a fan-shaped serif.

7. The method in claim 1, wherein said adjusting comprises removing a partial circular central portion from said serif to form a partial ring-shaped serif.

8. The method in claim 1, further comprising approximating a size and shape of said serif using segments of horizontal, vertical, and 45° lines to replace curved portion of said serif.

9. The method in claim 1, wherein:

said serif has a radius R, said first aerial image intensity is based on a contribution of light passing through a first circle of said mask and said serif having said radius R and being centered at said corner; and said second aerial image intensity is based on a contribution of light passing through a second circle of said mask having said radius R and being centered at said point along said edge.

10. A method of designing a photolithographic mask comprising:

defining a device shape on said mask, said device shape having at least one inside corner and at least one straight edge;

forming a partial circular hole in said corner to prevent rounding of said corner in an image produced using said mask; and adjusting a size and shape of said hole such that a first aerial image intensity at said corner is equal to a second aerial image intensity at a point along said edge.

11. The method in claim 10, wherein said hole comprises a quarter-circle hole.

12. The method in claim 10, wherein said hole has an opposite transparency from said design shape.

13. The method in claim 10, wherein said adjusting comprises one of adding and removing rectangular strips to/from straight edges of said hole.

14. The method in claim 13, wherein said rectangular strips have an edge aligned with an edge of said device shape.

15. The method in claim 10, wherein said adjusting comprises one of adding and removing angle sections to/from said hole to form a fan-shaped hole.

16. The method in claim 10, wherein said adjusting comprises removing a partial circular central portion from said hole to form a partial ring-shaped hole.

17. The method in claim 10, further comprising approximating a size and shape of said hole using segments of horizontal, vertical, and 45° lines to replace curved portion of said hole.

18. The method in claim 10, wherein:

said hole has a radius R, said first aerial image intensity is based on a contribution of light passing through a first circle of said mask and said hole having said radius R and being centered at said corner; and said second aerial image intensity is based on a contribution of light passing through a second circle of said mask having said radius R and being centered at said point along said edge.

19. A photolithographic mask comprising:

a device shape, said device shape having at least one outside corner and at least one straight edge; and a partial circular serif centered at said corner, said serif preventing rounding of said corner in an image produced using said mask, wherein a first aerial image intensity at said corner is equal to a second aerial image intensity at a point along said edge.

20. The photolithographic mask in claim 19, wherein said serif comprises a quarter-circle serif.

21. The photolithographic mask in claim 19, wherein said serif has a same transparency as said design shape.

22. The photolithographic mask in claim 19, wherein said serif includes one of rectangular strips and rectangular holes along straight edges of said serif.

23. The photolithographic mask in claim 19, wherein said rectangular strips and said rectangular holes have an edge aligned with an edge of said device shape.

24. The photolithographic mask in claim 19, wherein said serif has a fan shape.

25. The photolithographic mask in claim 19, wherein said serif has a hole in a partial circular central portion and comprises a partial ring-shaped serif.

26. The photolithographic mask in claim 19, wherein:

said serif has a radius R, said first aerial image intensity is based on a contribution of light passing through a first circle of said mask having said radius R and being centered at said corner; and said second aerial image intensity is based on a contribution of light passing through a second circle of said mask having said radius R and being centered at said point along said edge.

27. A photolithographic mask comprising:

a device shape, said device shape having at least one inside corner and at least one straight edge; and a partial circular hole centered at said corner, said hole preventing rounding of said corner in an image produced using said mask, said hole having a radius, wherein a first aerial image intensity at said corner is equal to a second aerial image intensity at a point along said edge.

28. The photolithographic mask in claim 27, wherein said hole comprises a quarter-circle hole.

29. The photolithographic mask in claim 27, wherein said hole has an opposite transparency from said design shape.

30. The photolithographic mask in claim 27, wherein said hole includes one of rectangular strips and rectangular holes along straight edges of said hole.

31. The photolithographic mask in claim 30, wherein said rectangular strips and said rectangular holes have an edge aligned with an edge of said device shape.

32. The photolithographic mask in claim 27, wherein said hole has a fan shape.

33. The photolithographic mask in claim 27, wherein said hole has a opposite transparency region in a partial circular central portion and comprises a partial ring-shaped hole.

34. The photolithographic mask in claim 27, wherein:

said hole has a radius R, said first aerial image intensity is based on a contribution of light passing through a first circle of said mask having said radius R and being centered at said corner; and said second aerial image intensity is based on a contribution of light passing through a second circle of said mask having said radius R and being centered at said point along said edge.

35. A program storage device readable by machine, tangibly embodying a program of instructions executable by the machine to preform a method of designing a photolithographic mask, said method comprising:

defining a device shape on said mask, said device shape having at least one outside corner and at least one straight edge;

adding a partial circular serif to said corner to prevent rounding of said corner in an image produced using said mask; and adjusting a size and shape of said serif such that a first aerial image intensity at said corner is equal to a second aerial image intensity at a point along said edge.

36. The program storage device in claim 35, wherein said serif comprises a quarter-circle serif.

37. The program storage device in claim 35, wherein said serif has a same transparency as said design shape.

38. The program storage device in claim 35, wherein said adjusting comprises one of adding and removing rectangular strips to/from straight edges of said serif.

39. The program storage device in claim 38, wherein said rectangular strips have an edge aligned with an edge of said device shape.

40. The program storage device in claim 35, wherein said adjusting comprises one of adding and removing angle sections to/from said serif to form a fan-shaped serif.

41. The program storage device in claim 35, wherein said adjusting comprises removing a partial circular central portion from said serif to form a partial ring-shaped serif.

42. The program storage device in claim 35, wherein said method further comprises approximating said size and shape of said serif using segments of horizontal, vertical, and 45° lines to replace curved portion of said serif.

43. The program storage device in claim 35, wherein:

said serif has a radius R, said first aerial image intensity is based on a contribution of light passing through a first circle of said mask having said radius R and being centered at said corner; and said second aerial image intensity is based on a contribution of light passing through a second circle of said mask having said radius R and being centered at said point along said edge.

* * * * *